United States Patent [19]

Nagaoka et al.

[11] 4,015,142
[45] Mar. 29, 1977

[54] ELECTRIC TIMING CIRCUITRY WITH MEANS TO COMPENSATE FOR SWITCH CHATTER

[75] Inventors: Shinji Nagaoka, Yotsukaido; Yuzuru Takazawa, Togane, both of Japan

[73] Assignee: Seiko Koki Kabushiki Kaisha, Japan

[22] Filed: Sept. 2, 1975

[21] Appl. No.: 609,537

Related U.S. Application Data

[63] Continuation-in-part of Ser. No. 598,073, July 22, 1975, abandoned.

[30] Foreign Application Priority Data

July 22, 1974 Japan .............................. 49-87188

[52] U.S. Cl. .......................... 307/247 A; 307/246; 307/254; 361/2
[51] Int. Cl.[2] ...................................... H03K 17/00
[58] Field of Search ............ 307/247 A, 246, 254; 317/9 C, 11 R; 340/365 E; 328/81

[56] References Cited

UNITED STATES PATENTS

| | | | |
|---|---|---|---|
| 3,727,141 | 4/1973 | Finlay | 307/247 A |
| 3,790,821 | 2/1974 | Adamson | 307/247 A |

OTHER PUBLICATIONS

I.B.M. Tech. Disclre. Blltn., Eliminating the Effect of Contact Bounce, by G. L. Bond, vol. 4, No. 9, 2/62, p. 9.

I.B.M. Tech. Disclre. Blltn., Bounce Eliminating Circuit, by U. Klose, vol. 14, No. 3, 8/71, p. 995.

*Primary Examiner*—Stanley D. Miller, Jr.
*Assistant Examiner*—B. P. Davis
*Attorney, Agent, or Firm*—Robert E. Burns; Emmanuel J. Lobato; Bruce L. Adams

[57] ABSTRACT

Electric timing circuitry for a camera comprises a series connection of a resistor and capacitor with the junction point of the two being connected to the input of a switching circuit. A series circuit composed of a starting switch for initiating the timing cycle and a source switch for connecting the circuitry to a source of electric energy is connected in parallel with the capacitor. The single capacitor performs the dual role of functioning as a timing capacitor and compensating for switch chatter of the source switch.

2 Claims, 2 Drawing Figures

ELECTRIC TIMING CIRCUITRY WITH MEANS TO COMPENSATE FOR SWITCH CHATTER

This application is a continuation-in-part application of Ser. No. 598,073 filed July 22, 1975, and now abandoned claiming priority of Japan U.M. application No. 87188/74 filed July 22, 1974.

BACKGROUND OF THE INVENTION

The present invention relates generally to timing circuits and more particularly, to means for compensating for the chattering of mechanical switches used in conjunction with timing circuits.

Electronic timing circuits are in widespread use in many different areas of technology and when used in mechanisms having moving parts, such as cameras, care must be taken to prevent disruption of the current flow due to switch chatter caused by the mechanical motion of the moving parts within the associated mechanism. For example, in electronic cameras utilizing electronic switching and timing circuits, these circuits are normally energized and deenergized through the synchronized action of mechanical switches which are actuated in dependence upon the position of a shutter release lever, the position of the shutter-opening mechanism, the position of the shutter-closing mechanism as well as the position of other movable parts within the camera. Due to the various types of movement and the high speed with which the parts are moved, vibrations and other spurious movements are imparted to the various camera components thereby causing undesired switch chatter. Switch chatter, or contact chatter as it is sometimes referred to, is the undesirable opening and closing of the switch contacts which usually results in current disruption or current oscillation in the associated circuitry.

In order to compensate for switch chatter, it is now a known practice to connect capacitors in parallel with the mechanical switches so that during switch chatter, charging current can flow to the capacitors thereby maintaining an uninterrupted current flow in the associated circuitry. This technique has proven effective in nullifying the effect of switch chatter however has the drawback that numerous capacitors are needed thereby increasing the number of parts and hence increasing the manufacturing cost of the circuits.

SUMMARY OF THE INVENTION

It is therefore a principal object of the present invention to overcome the drawbacks of the conventional circuits and effectively compensate for switch chatter by using a lesser number of parts than used in conventional circuits to accomplish the same result.

Another object of the present invention is to provide means for compensating for switch chatter in a timing circuit by using the time capacitor as the compensating capacitor thereby reducing the number of parts and reducing the manufacturing cost.

These and other objects of the invention are realized by a timing circuit comprised of a series connection of a resistor and capacitor with the junction point of the two being connected to the input of a switching circuit. A series circuit composed of a starting switch and a source switch is connected between the said junction point and the side of the capacitor which is connected to a source of electric energy. By such a construction, the single capacitor performs the dual role of functioning as a timing capacitor and also compensating for source switch chatter.

Additional objects, features and advantages of the invention will become apparent from an understanding of this disclosure which is hereinafter set forth in sufficient detail to readily enable those persons skilled in the art to clearly understand the function, operation and advantages of the invention when read in conjunction with the accompanying drawings.

DETAILED DESCRIPTION OF THE PREFERRED EMBODIMENT

Before discussing the present invention and in other to better understand and appreciate the same, a brief description of the prior art circuitry will first be given with reference to FIG. 1. The electric circuitry comprises a timing circuit connected to activate a switching circuit after the elapse of a predetermined time and this type of circuitry is in widespread use in electronic cameras. The timing circuit comprises a series circuit composed of a timing resistor R and a capacitor $C_o$ which form a standard integrating circuit $R-C_o$.

The switching circuit comprises a Schmidt trigger circuit composed of transistors T1 and T2. The emitters of both transistors are connected together and the collector of the transistor T1 is connected to the base of the transistor T2 so that the conductive state of the transistor T2 is determined by the output of the transistor T1. A load RL is connected to the collector of the transistor T2 and a resistor r1 is connected to the common emitters of the transistors T1 and T2. Another resistor r2 is connected to the collector of the transistor T1 and another resistor r3 is connected between the base of the transistor T1 and the junction point of the resistor R and the capacitor $C_o$ of the timing circuit.

Figure 1:
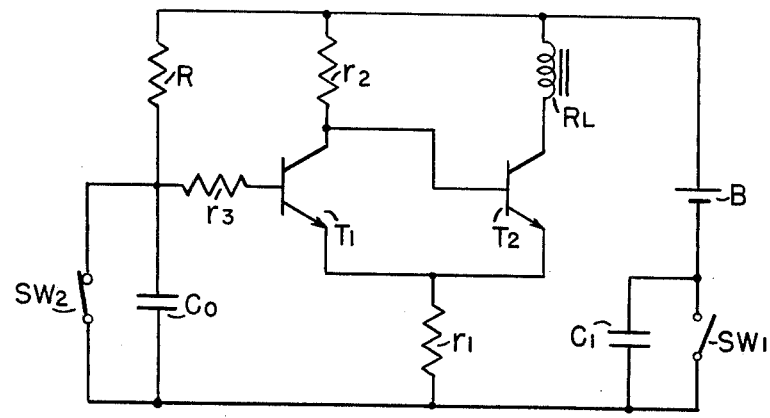
FIG. 1 is a circuit diagram of conventional circuitry including a timing circuit and a switching circuit.

The timing circuit and the switching circuit are connected as shown in FIG. 1 to a source of electric energy B through a normally open source switch SW1 and a normally closed starting switch SW2. A capacitor C1 is connected in parallel with the source switch SW1 so as to compensate for chattering of the switch as explained hereafter. During operation of the electric circuitry and assuming the circuitry is in the condition shown in FIG. 1, the compensating capacitor C1 becomes charged and assumes the potential of the source of electric energy B. When the source switch SW1 is closed, current flows through the load RL, the collector-emitter path of the transistor T2 and through the resistor r1. At this time, the transistor T1 remains nonconductive upon opening of the starting switch SW2 to initiate the timing cycle, and after a predetermined time delay determined by the RC constant of the timing circuit,; the transistor T1 turn on thereby turning off the transistor T2. Current ceases to flow through the load RL and such completes the cycle of operation of the circuitry.

At the moment that the source switch SW1 is closed, the compensating capacitor C1 immediately begins discharging as it is now short circuited. Hence when the switch SW1 begins to chatter, i.e., rapidly open and close, and due to the fact that the transistor T2 is at this time conductive, charging current flows to the compensating capacitor C1 through the load RL and the collector-emitter path of the transistor T2 at those moments when the source switch is open. In this manner, the charging current compensates for the momentary opening of the source switch SW1 and ensures that current continues to flow through the load RL. Thus the compensating capacitor C1 effectively compensates for chattering of the source switch SW1 and maintains continuous current flow through the load RL during conduction of the transistor T2.

Thus it may be appreciated that in the prior art circuitry, the compensating capacitor C1 is needed in addition to the timing capacitor $C_o$ with each capacitor performing its specified function. In accordance with the principles of the invention, the circuitry is modified so that a single capacitor effects both the timing and compensating functions thereby reducing the number of circuit elements, simplifying the circuitry and reducing its cost of manufacture.

Figure 2:
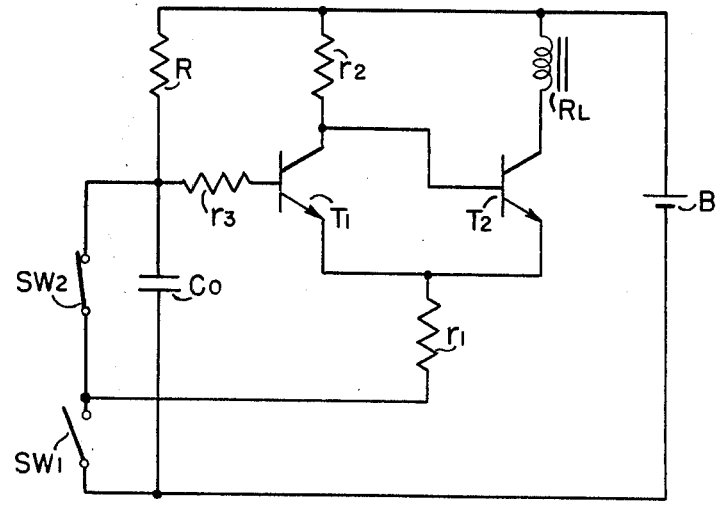
FIG. 2 is a circuit diagram of the inventive circuitry including a timing circuit and a switching circuit and using a common capacitor for both the timing function and the switch chatter compensating function.

The inventive circuitry is shown in FIG. 2 and the circuit elements corresponding to those of FIG. 1 are represented by the same reference characters. In the inventive circuitry, the source switch SW1 and the starting switch SW2 are connected in series circuit relationship with the junction point between the switches being connected to the resistor r1. One side of the starting switch SW2 is connected to the junction point of the resistor R and capacitor $C_o$ and is connected through the resistor R to the positive terminal of the source B. One side of the source switch SW1 is connected to the negative terminal of the source B as is one side of the capacitor $C_o$. By such a construction, the series circuit composed of the switches SW1 and SW2 is connected in parallel with the capacitor $C_o$ and this arrangement is possible due to the fact that the operating period of the source switch SW1 differs from that of the starting switch SW2.

The mode of operation of the inventive circuitry shown in FIG. 2 is basically similar to that of FIG. 1. The source switch SW1 is normally open and the starting switch SW2 is normally closed. When the source switch SW1 is closed, the transistor T1 remains non-conductive and thereby biases on the transistor T2 so that current flows from the source B through the load RL, the collector-emitter path of transistor T2, the resistor r1 and through the source switch SW1. At this time, the starting switch SW2 is closed so that the capacitor $C_o$ is effectively short circuited and therefore remains discharged. In the event of switch chatter of the source switch SW1, and by reason of the fact that the capacitor $C_o$ is arranged in parallel with the source switch SW1 through the starting switch SW2 which is at this time closed, charging current flows from the source B through the load RL, the collector-emitter path of the transistor T2, resistor r1 and starting switch SW2 to the capacitor $C_o$ thereby preventing disruption of current flow through the load due to chattered opening of the switch SW1. It is understood that during the brief moments that the source switch SW1 opens during the chatter phenomenon, the capacitor $C_o$ does not become fully charged since each time the switch SW1 closes again, the capacitor $C_o$ is short circuited and discharges.

During a later stage of operation of the circuitry, the starting switch SW2 is opened to commence starting of the timing cycle thereby enabling charging of the capacitor $C_o$ through the resistor R. The RC constant of the timing circuit will determine the rate of charging of the capacitor $C_o$ and when the capacitor becomes sufficiently charged, the junction point between the resistor R and the capacitor $C_o$ applies sufficient voltage to the base of the transistor T1 to bias it to conduction thereby turning off transistor T2 so as to terminate current flow through the load RL. Hence it can be seen that the source switch SW1 and starting switch SW2 have different active periods during the operation of the circuitry so that they both can be used in conjunction with a common capacitor $C_o$ which performs both a timing function and a chatter compensating function. The circuitry of FIG. 2 requires only the capacitor $C_o$ and does not require the additional capacitor C1 as is needed in the prior art circuitry as shown in FIG. 1. Thus a lesser number of parts are needed in the inventive circuitry thereby facilitating its manufacture and reducing the costs of manufacture.

Numerous changes and modifications will become apparent to those skilled in the art and the present invention is intended to cover all such obvious changes and modifications falling within the spirit and scope of the invention as defined in the appended claims.

We claim:

1. An electric timing circuitry connectable to a source of electric energy during use and of the type having a switching circuit switchable to one state after the closing of a normally open source switch to effect current flow through a load and switchable to another state to terminate current flow through said load, and a timing circuit including a series connection of a resistor and capacitor having a junction point connected to said switching circuit and operable in response to the opening of a normally closed starting switch to initiate the running of a predetermined time period and effect switching of said switching circuit from said one state to said another state after the elapse of said predetermined time period: means for compensating for switch chatter of said source switch comprising means connecting said source switch and starting switch in a series circuit and connecting said series circuit in parallel with said capacitor so that said capacitor performs the dual function of a chatter-compensating capacitor for said source switch and a timing capacitor for said timing circuit.

2. Electric timing circuitry as claimed in claim 1; wherein said means connecting said series circuit in parallel with said capacitor comprises means connecting one side of said starting switch to said junction point of said resistor and capacitor, and means connecting one side of said source switch to the other side of said capacitor.

* * * * *